United States Patent
LaBounty et al.

(10) Patent No.: US 9,201,103 B2
(45) Date of Patent: Dec. 1, 2015

(54) CIRCUITS, ARCHITECTURES, APPARATUSES, METHODS AND ALGORITHMS FOR DETERMINING A DC BIAS IN AN AC OR AC-COUPLED SIGNAL

(75) Inventors: Chris LaBounty, Moorpark, CA (US); Todd Rope, Glendale, CA (US); Tomas J. Ciplickas, Canyon County, CA (US); Near Margalit, Westlake Village, CA (US)

(73) Assignee: Source Photonics, Inc., Chatsworth, CA (US)

( * ) Notice: Subject to any disclaimer, the term of this patent is extended or adjusted under 35 U.S.C. 154(b) by 1021 days.

(21) Appl. No.: 13/206,285

(22) Filed: Aug. 9, 2011

(65) Prior Publication Data

US 2013/0039663 A1      Feb. 14, 2013

(51) Int. Cl.
*H02P 1/54* (2006.01)
*H02M 7/5387* (2007.01)
*G01R 19/25* (2006.01)

(52) U.S. Cl.
CPC .................................. *G01R 19/2506* (2013.01)

(58) Field of Classification Search
CPC .................................................. G01R 19/2506
USPC ................... 324/76.38; 318/100; 363/132, 55
See application file for complete search history.

(56) References Cited

U.S. PATENT DOCUMENTS

| | | | |
|---|---|---|---|
| 6,844,690 B2* | 1/2005 | Kalman et al. | 318/100 |
| 7,200,336 B2 | 4/2007 | Yu et al. | |
| 7,650,077 B2 | 1/2010 | Yu et al. | |
| 2003/0007438 A1* | 1/2003 | Kim et al. | 369/53.26 |
| 2003/0042889 A1* | 3/2003 | Harris et al. | 324/158.1 |
| 2004/0144913 A1* | 7/2004 | Fennelly et al. | 250/214 R |
| 2005/0008280 A1* | 1/2005 | Howley | 385/14 |
| 2006/0007719 A1* | 1/2006 | Shannon et al. | 363/132 |
| 2010/0195357 A1* | 8/2010 | Fornage et al. | 363/55 |

FOREIGN PATENT DOCUMENTS

| | | |
|---|---|---|
| CN | 201104240 Y | 8/2008 |
| CN | 101350494 A | 1/2009 |
| CN | 101937017 A | 1/2011 |

OTHER PUBLICATIONS

Zhongliang Li et al.; "Semiconductor Laser Single Light Source Shock Excitation Measuring Device"; Bibliographic Data of CN201104240 (Y); Aug. 20, 2008; http://worldwide.espacenet.com.
(Continued)

*Primary Examiner* — Melissa Koval
*Assistant Examiner* — Farhana Hoque
(74) *Attorney, Agent, or Firm* — Andrew D. Fortney; Central California IP Group, P.C.

(57) ABSTRACT

Methods, circuits, architectures, apparatuses, and algorithms for determining a DC level in an AC or AC-coupled signal. The method generally includes disabling the AC or AC-coupled signal; sampling the disabled AC or AC-coupled signal to obtain sampled DC values of the AC or AC-coupled signal; and calculating the DC level using the sampled DC values of the AC or AC-coupled signal. The present transmitter generally includes an electro-absorption modulated laser (EML); a photodetector; a signal source configured to provide an AC or AC-coupled signal to the EML; and a microcontroller or microprocessor configured to (i) control the signal source, (ii) receive information from the photodetector, and (iii) deactivate the signal source for a predetermined length of time. The circuits, architectures, and apparatuses generally include those that embody one or more of the inventive concepts disclosed herein.

19 Claims, 5 Drawing Sheets

(56) References Cited

OTHER PUBLICATIONS

Jiubin Tan et al.; "Method and Apparatus for Frequency Stabilzation of Accurate Separated Longitudinal Zeeman Laser Base on Optical Power"; Bibliographic Data of CN101350494 (A); Jan. 21, 2009; http://worldwide.espacenet.com.

Xuan Zhou et al.; "Dynamic Direct-Current Removing Method for Intelligent Electric Meter During Alternating-Current Sampling"; Bibliographic Data of CN101937017 (A); Jan. 5, 2011; http://worldwide.espacenet.com.

* cited by examiner

CIRCUITS, ARCHITECTURES, APPARATUSES, METHODS AND ALGORITHMS FOR DETERMINING A DC BIAS IN AN AC OR AC-COUPLED SIGNAL

FIELD OF THE INVENTION

The present invention generally relates to measuring a DC component of an AC or AC-coupled signal and/or a DC offset of AC signal detection circuitry in electronic circuitry. More specifically, embodiments of the present invention pertain to methods, circuits, architectures, apparatuses, and algorithms for determining a DC level in an AC or AC-coupled signal and/or a DC offset in AC signal detection and/or processing circuitry, and calculating a value of one or more parameters based on the DC level.

DISCUSSION OF THE BACKGROUND

In circuitry that receives an AC signal ("AC-coupled circuitry"), a DC component of a complex wave (i.e., one containing both AC and DC components) is a current component that has an unchanging polarity. That is, the DC component is the mean (average) value at which the AC component(s) alternate, pulsate, or fluctuate. An AC waveform with a zero DC component (i.e., an AC waveform having an average value of zero) is known as a DC-balanced waveform. In waveforms that are not DC-balanced, a DC offset can be introduced to counter the DC component and balance the waveform, making accurate DC component determination particularly important. DC-balanced waveforms can be used in AC-coupled circuitry (e.g., optical or electrical communication and/or storage circuits) to avoid voltage imbalance problems between connected systems and components.

In certain AC-coupled circuitry (e.g., optical detectors, optical transmitters, etc.), an off-state DC level is introduced by the AC-coupled circuitry itself. For example, in optical detectors, an unwanted DC level is introduced by dark current. Dark current is the electrical current that flows through the detector when the detector is not exposed to light or a light signal. Introduction of the unwanted DC level increases the DC component of the AC signal. An accurate determination of the DC level can be particularly important in seeking to avoid voltage imbalance problems. Accurate DC level determination can also be particularly important in optical or electrical communication circuitry (e.g., an optical transmitter) having a strict extinction ratio (ER) requirement.

An ER is a ratio of the maximum power of an AC signal to the minimum power of the AC signal. In many AC-coupled systems, the minimum zero-level power $P_0$ is near the off-state power (e.g., $P_{OFF}$) of the AC-coupled circuitry in the absence of the AC signal. The extinction ratio is generally expressed as a fraction in dB, or as a percentage, and can be calculated according to Equation [1] below:

$$ER=(P_1-P_{OFF})/(P_0-P_{OFF}) \qquad [1]$$

where $P_{OFF}$ is the off-state power, $P_1$ is the maximum power of the AC signal, and $P_0$ is the minimum power of the AC signal. The minimum or zero-level power $P_0$ is oftentimes very close to the off-state power $P_{OFF}$ (e.g., the power leaked by the AC-coupled circuitry). Thus, utilizing an inaccurate $P_{OFF}$ value in Equation [1] can result in the denominator having a calculated value significantly different from the actual value, resulting in inaccurate ER values.

Conventional methods of determining a DC level or DC component (e.g., an off-state power $P_{OFF}$) in an AC or AC-coupled signal may include the use of a DC probe, a signal tap, or additional circuitry to mirror or directly measure the DC component. However, such methods may inaccurately determine the off-state power (e.g., $P_{OFF}$) as having the same value as that of the zero-level power ($P_0$), resulting in an inaccurate ER value (e.g., an ER value calculated using Equation [1]). That is, such methods and circuitry do not always accurately detect the DC level of the AC-coupled signal that is introduced by the AC-coupled circuit itself. Such methods can cause detrimental effects to the signal quality of the received AC signal, especially in high-frequency or high data-rate systems, resulting in inaccurate DC level determinations. Additionally, such techniques can add unwanted complexity to a product including the AC-coupled circuitry. Thus, although DC-coupled designs can greatly simplify the measurement of the DC component or DC offset, such designs add greater complexity in the AC performance of the system.

For example, utilizing a DC probe to determine a DC level may result in an inaccurate DC voltage measurement due to the internal circuitry of the DC probe. The forward voltage drop (e.g., about 0.70V) of an internal diode in the DC probe may limit accurate measurements of voltages less than or about equal to the forward voltage drop of the diode. Additionally, DC component measurements utilizing a signal tap or additional circuitry (e.g., a DC mirror circuit) may decrease the accuracy of the measurement due to the introduction of additional loads (e.g., impedance) or noise on the AC-coupled circuitry.

This "Background" section is provided for background information only. The statements in this "Background" are not an admission that the subject matter disclosed in this "Background" section constitutes prior art to the present disclosure, and no part of this "Background" section may be used as an admission that any part of this application, including this "Background" section, constitutes prior art to the present disclosure.

SUMMARY OF THE INVENTION

Embodiments of the present invention relate to methods, circuits, architectures, apparatuses, and algorithms for determining (i) a DC level or component in an AC signal or an AC-coupled signal, and/or (ii) a DC offset of AC signal detection and/or processing circuitry. The method generally comprises disabling the AC-coupled signal, sampling the disabled AC-coupled signal to obtain sampled DC values of the AC-coupled signal, and calculating the DC level using the sampled DC values of the AC-coupled signal.

In various embodiments, disabling the AC-coupled signal comprises disabling modulation of the AC or AC-coupled signal or disconnecting a power supply to the AC signal source. Such embodiments are consistent with determining a DC level in an AC or AC-coupled signal. Alternatively, disabling the AC-coupled signal may comprise switching off the AC-coupled signal or executing a command (e.g., in a microprocessor or microcontroller) configured to switch off the AC-coupled signal. Such embodiments are consistent with determining a DC offset in AC signal detection and/or processing circuitry. In further embodiments, the method may further comprise enabling the AC-coupled signal after sampling the disabled AC-coupled signal at least once, but prior to the disabled AC-coupled signal reaching a common-mode voltage.

The circuit generally comprises a signal source configured to provide an AC signal or an AC-coupled signal, a signal detector configured to receive the AC or AC-coupled signal and provide information about the AC or AC-coupled signal, and a microcontroller or microprocessor configured to (i)

control the signal source, (ii) receive the information from the signal detector, and (iii) deactivate the signal source for a predetermined length of time. The circuit may be included in an optical or optoelectronic transmitter or transceiver, in which case the signal source may be a driver for a laser diode (e.g., for an electro-absorption modulated laser, or EML), and the signal detector may comprise a photodetector.

In various embodiments, the circuitry comprises a switch coupled between the signal source and the signal detector, where the switch is controlled by the microcontroller or microprocessor. Additionally, the signal detector may comprise an analog-to-digital converter (ADC), and can be coupled to the microcontroller or microprocessor and configured to provide information to the microcontroller or microprocessor. Furthermore, in various embodiments, the microcontroller or microprocessor is configured to determine a DC level, component or offset of the information received from the signal detector. The calculated DC level, component or offset may be used to determine one or more parameters (such as the extinction ratio) of the circuit. For example, using the sampled DC values of the AC-coupled signal, the extinction ratio can be calculated according to Equation [1] above. The architectures and/or systems generally comprise those that include a circuit embodying one or more of the inventive concepts disclosed herein.

The present invention advantageously determines an accurate or precise DC level or component, suitable for optical and/or electrical circuitry requiring an accurate or precise DC level determination of an output from AC-coupled circuitry. For example, the invention may be useful for accurate determination of circuit and/or performance parameters (such as an extinction ratio) requiring an accurate or precise DC level determination. These and other advantages of the present invention will become readily apparent from the following description of various embodiments.

DETAILED DESCRIPTION

Figure 1:
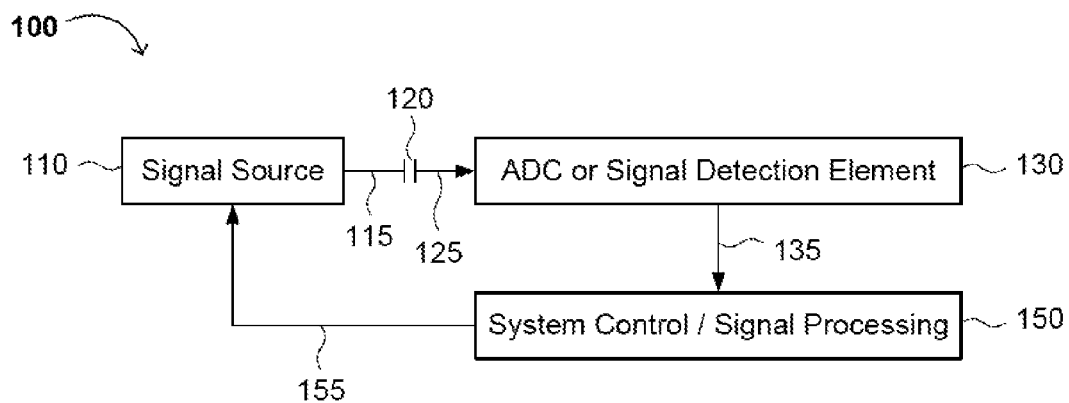
FIG. 1 is a diagram illustrating an exemplary circuit for determining a DC level or component of an AC or AC-coupled signal.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "AC signal," "AC-coupled signal," and "AC or AC-coupled signal," are generally used interchangeably herein, and use of any one of these terms also includes the others, unless the context clearly indicates otherwise. Also, for convenience and simplicity, the terms "connected to," "coupled with," "coupled to," and "in communication with" (which terms also refer to direct and/or indirect relationships between the connected, coupled and/or communicating elements unless the context of the term's use unambiguously indicates otherwise) may be used interchangeably, but these terms are also generally given their art-recognized meanings.

The present invention concerns methods, circuits, architectures, apparatuses, and algorithms for determining a DC level or component in an AC or AC-coupled signal and/or measuring a DC offset of an AC signal detector and/or processor. The method generally comprises disabling the AC-coupled signal, sampling the disabled AC-coupled signal to obtain sampled DC values of the AC-coupled signal, and calculating the DC level, component or offset using the sampled DC values of the AC-coupled signal. In various embodiments, the circuit generally comprises a signal source configured to provide an AC or AC-coupled signal, a signal detector configured to receive the AC or AC-coupled signal, and a microcontroller or microprocessor configured to (i) control the signal source, (ii) receive information from the signal detector, and (iii) deactivate the signal source for a predetermined length of time. The architectures and/or systems (e.g., a transceiver or transmitter) generally comprise the present circuit and/or any circuit embodying the inventive concepts described herein.

The present method and circuitry can be used to accurately determine a DC level component in an AC or AC-coupled signal, as well as a DC offset in an AC signal detector and/or processor. Many important communication signals in optical or optoelectronic communication circuitry (e.g., an optical transmitter) are AC or AC-coupled signals having a non-zero DC component or DC level. For example, the present methods and circuitry can be used to accurately determine a DC level of a signal output by AC-coupled circuitry (e.g., a driver in an optical transmitter). By accurately determining the DC level, accurate parameter values for the optical and/or electronic circuitry can be determined, and the circuitry can operate with increased efficiency. For example, the present methods and circuitry can be used to accurately calculate an ER of an optical transmitter, and the AC-coupled circuitry of the transmitter can be adjusted as needed or desired (e.g., via a microcontroller and an ADC), to maintain or improve the signal integrity of the AC or AC-coupled signal. The present methods and circuitry can similarly measure or determine the DC offset of a signal detector/processor configured to receive the AC or AC-coupled signal. The present invention is particularly advantageous in high-frequency or high data-rate systems, in which inaccurate DC level or component measurements or determinations can dramatically effect calculations of important performance parameters such as the extinction ratio.

The invention, in its various aspects, will be explained in greater detail below with regard to exemplary embodiments.

An Exemplary Circuit for Determining a DC Level in an AC or AC-Coupled Signal

FIG. 1 shows a first exemplary circuit 100 for determining a DC level or component of an AC signal or an AC-coupled signal. As shown, circuit 100 comprises AC signal source 110, capacitor 120, analog-to-digital converter (ADC) or signal detection element 130, and system controller/signal processing circuitry 150. AC signal source 110 can be substantially any circuit that generates or produces an AC signal. For example, AC signal source 110 can be a driver circuit configured to output an AC signal carrying data or a bias current, a power supply providing an AC power, a modulator configured to provide a modulated signal, etc. In particular, when the system comprises an optical transmitter, the driver circuit may comprise laser driver circuitry, such as an EML laser driver, a DML laser driver, etc. AC signal source 110 is configured to provide an AC signal 115 to capacitor 120. Capacitor 120 represents a capacitance, and may comprise a single capacitor or another capacitance device or circuit (e.g., an array of capacitors). Capacitor 120 (which is optional) may provide a filtered or smoothed AC signal 125 to the signal detector (e.g., signal detection element) and/or ADC 130.

Signal detection element 130 can be a conventional AC signal detector or other circuit configured to sample the AC signal and determine a value of the sampled AC signal. The AC signal may be sampled periodically or in response to one or more control signals. For example, the signal detector may comprise an analog-to-digital converter, and in some embodiments, one or more latches configured to store a value of the AC signal. The ADC 130 may have an output width of at least two bits (e.g., from 2 to 8, 12, 14, or 16 bits).

Signal detection element 130 is configured to convert the analog AC signal to a digital signal. Sampling is performed to provide a digital or multi-bit binary signal 135 representative of AC signal 125 (e.g., a digital signal 135 having a value in binary code proportional to a magnitude of analog AC signal 125), suitable for processing by system control/signal processing circuitry 150. In various embodiments, signal detector/ADC 130 may sample AC signal 115 or 125 from 1 to $10^6$ times per second (e.g., from 10 to 1000 Hz; in two examples, either 50 or 100 times per second). Alternatively, signal detection element 130 may be configured to output a digital value of AC signal 125 directly, without sampling the AC signal 125.

System control/signal processing circuitry 150 processes the digital signal 135 and provides one or more control signals 155 to AC signal source 110. In various embodiments, signal controller/signal processing circuitry 150 can be a microprocessor, a microcontroller, a digital signal processor, a FPGA or an ASIC. The control signal(s) 155 provided by system control/signal processing circuitry 150 include a control signal that is configured to adjust an output of AC signal source 110 during normal operation (e.g., increase a maximum power level, decrease a frequency, etc.) and/or a disable signal configured to disable modulation of the AC signal 115 or deactivate the AC signal output from AC signal source 110. In one embodiment, the control signal(s) 155 include a signal configured to disable an output device (e.g., a buffer, output driver, or current source/sink) in AC signal source 110 for a predetermined amount of time.

Activation of the disable signal 155 can be based on one or more predetermined criteria (e.g., exceeding a threshold, such as the limit of acceptable variation in the AC signal 115/125, that may be determined or defined by software in system control/system processing circuitry 150). Alternatively, or additionally, activation of disable signal 155 can be based on one or more external control signals (e.g., provided by an external host or control circuit, etc.). In general, at least one disable signal 155 is provided to AC signal source 110 for a predetermined minimum period of time, sufficient to enable an accurate determination of the DC level or component of AC signal 115. Determination of the DC level is described in further detail below with respect to FIGS. 2-3.

An Exemplary Method of Determining a DC Component of an AC or AC-Coupled Signal

Figure 2:
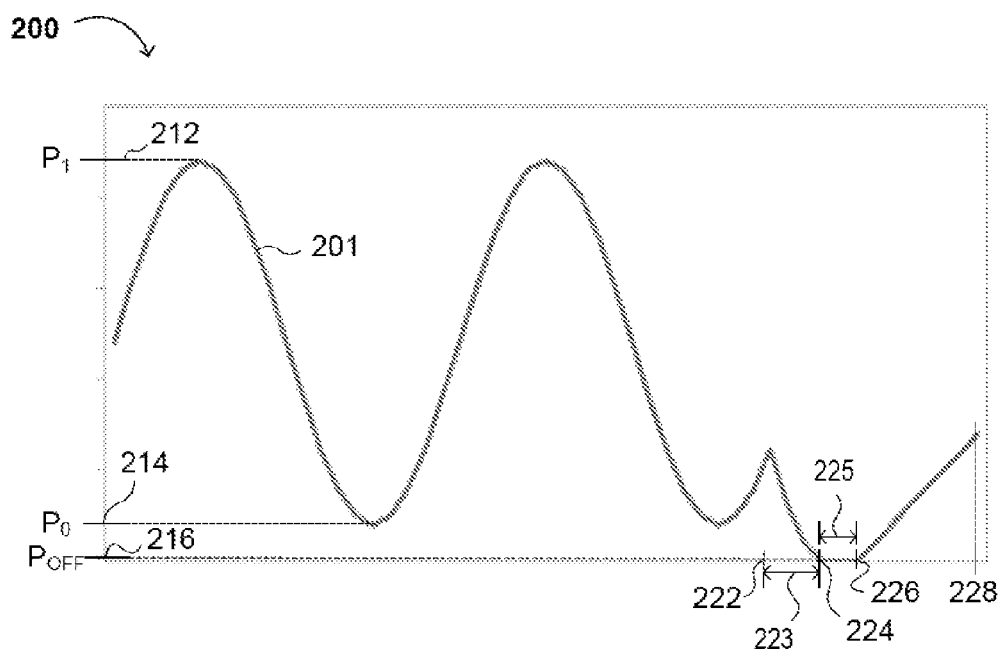
FIG. 2 is a graph illustrating an exemplary output of the exemplary AC signal source of FIG. 1.

In FIG. 2, graph 200 shows a waveform 201 representing a power of an exemplary continuous or substantially continuous AC signal (e.g., AC-coupled signal 115 from AC signal source 110 in FIG. 1) as a function of time. As shown in FIG. 2, waveform 201 has a maximum power (e.g., power $P_1$) 212 and a minimum power (e.g., a zero-level power $P_0$) 214. At time 222 in FIG. 2, the AC signal source providing waveform 201 receives a disable signal (e.g., one or more of the signals 155 from signal control/signal processing circuitry 150 in FIG. 1) configured to disable modulation of the exemplary AC signal or disable or disconnect a power provided to the AC signal source. Thus, at time 222, the power of the AC signal shown in waveform 201 begins to decrease, and the decrease continues for a duration of time 223, until time 224, at which time the AC signal reaches an off-state power level (e.g., $P_{OFF}$) 216. The duration of time 223 may be dependent on the power level of AC signal 115 at the time AC signal source 110 receives a disable signal. For example, when the power level at time 222 is at a power level 212, the duration of time required for the AC signal to reach off-state power 216 may be greater than that shown in FIG. 2 (e.g., a time period greater than time duration 223). As shown, off-state power (e.g., $P_{OFF}$) 216 has a value less than that of minimum power level (e.g., $P_0$) 214.

At time 224, the power level of the AC signal represented by waveform 201 remains at power level 216 for a duration or period of time 225, until time 226. Time period 225 allows the DC level of AC signal 201 to be determined before the output of the disabled AC signal source 110 begins to increase and approach a common-mode or other AC-driven voltage (e.g., as waveform 201 shows from time 226 to time 228). This common-mode voltage does not represent an accurate DC level of the AC signal (e.g., AC signal 125 in FIG. 1). However, during time period 225, power level 216 (e.g., power $P_{OFF}$) can be accurately estimated or measured (e.g., via signal detection element/ADC 130 and system control 150). When AC signal source 110 is reactivated (e.g., the disable signal is deactivated), the waveform 201 representing the AC signal returns to a continuous AC output waveform, similar to that shown prior to the AC signal source 110 receiving the disable signal at time 222.

Thus, with the present circuitry, the output 115 of the AC signal source 110 can be disabled, thereby enabling accurate determinations of the DC level of the AC or AC coupled signal output by AC signal source 110. The accurate DC level determination can then be used to accurately determine or calculate parameter values (e.g., the extinction ratio) of AC signal 115. For example, the extinction ratio of AC signal 115 can be determined according to Equation [1] above using values obtained from waveform 201.

Figure 3:
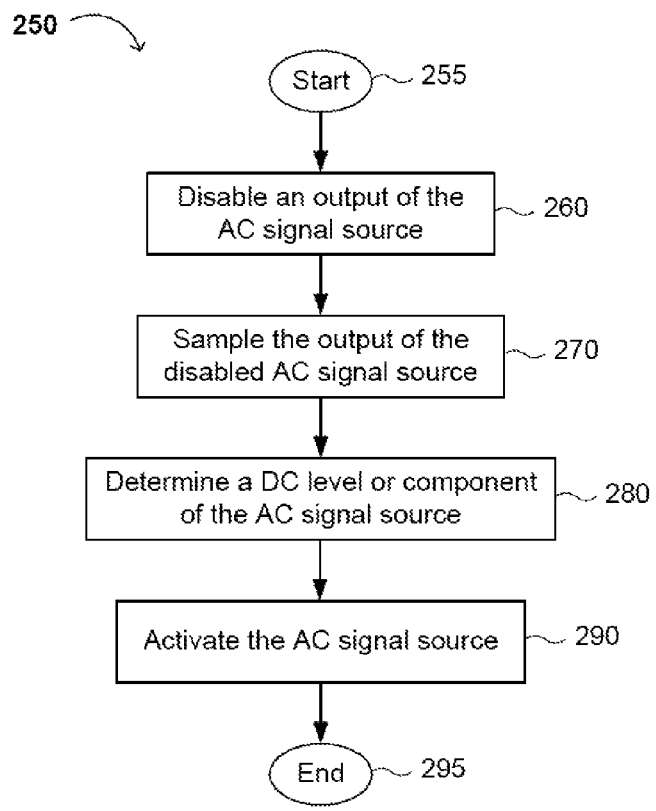
FIG. 3 is a flowchart showing an exemplary method for determining a DC level or component according to the present invention.

As shown in FIG. 3, flowchart 250 illustrates a method of determining a DC level or component of an AC or AC-coupled signal (e.g., provided by an AC signal source). As shown, at 255 the method begins, and at 260, an output of the AC signal source is disabled or deactivated. In one embodiment, the method comprises disabling an output of the AC signal source via a disable signal (e.g., signal 155 discussed above with respect to FIG. 1). For example, the disable signal can be configured to disable a power provided to the AC signal source 110 (e.g., disable a voltage source providing an operating voltage(s) to AC signal source 110), or disable circuitry within AC signal source 110, such as an output buffer or driver within AC signal source 110 that, when disabled, disables an output of the AC signal source 110. Alternatively, the output of the AC signal source can be disabled by turning off (e.g., opening) a switch (e.g., as discussed below in further detail with respect to FIGS. 4-5).

At 270, the output of the disabled AC signal source is sampled. The output can be sampled via a signal detection element (e.g., ADC 130 in FIG. 1) configured to detect and sample an output of the AC signal source. In one embodiment, the method also comprises providing a digital representation of the sampled AC signal to a control circuit (e.g., a microprocessor or microcontroller). The control circuit can be configured to determine, for example, a maximum power level of the AC signal source (e.g., power level 212 discussed above with respect to FIG. 2), a minimum power level of the AC signal source (e.g., power level 214 discussed above with respect to FIG. 2), and a time duration (e.g., a measurement window) in which the DC level or component of the AC signal can be determined.

For example, the control circuit can specify or determine when a first time duration begins (e.g., when the disable signal is enabled) and when the first time duration ends (e.g., when the power level of the disabled AC signal has decreased to a negative peak, generally representative of the power-off level). Thus, following the first time duration, the control circuit determines when a second time duration (e.g., a DC level or component measurement window) begins (e.g., at power level 216 in FIG. 2). Additionally, the control circuit determines when the DC component measurement window (e.g., time duration 225 in FIG. 2) ends by either determining when the level or voltage of the AC signal begins to increase (e.g., time 226 in FIG. 2) towards a common-mode or other AC-driven voltage that does not represent an accurate DC level of the AC-coupled signal (e.g., from time 226 to time 228 in FIG. 2), or by allowing a predetermined period of time to elapse (which can be determined by a conventional timer circuit).

At 280, the DC level or component of the AC signal is determined. For example, the DC component can be determined by measurement. In various embodiments, an external measurement device (e.g., a multi-meter, a millivolt meter or other voltage sensor, an oscilloscope, etc.) can be electrically connected to the AC-coupled circuitry and/or the AC signal source to accurately measure the DC level or component of the disabled AC signal. Alternatively, the DC component can be accurately measured using signal processing circuitry (e.g., system control/signal processing circuitry 150 in FIG. 1). For example, the signal processing circuitry can determine a DC level or component measurement window in which the DC level or component will be determined, and using a negative peak detector, subsequently determine a power level (e.g., a negative peak power level) of the AC signal when the AC signal source is disabled (e.g., during the measurement window). The signal processing circuitry can also use a timer or voltage detector to determine when the DC level or component measurement window expires.

At 290, the AC signal source (e.g., AC signal source 110 discussed above with regard to FIG. 1) is enabled or activated. In one embodiment, the method comprises activating the AC signal source by providing one or more voltage(s) or connecting one or more power supplies to the AC signal source. In other embodiments in which a switch is used to disable an output of the AC signal source, the switch is turned on (e.g., closed) to reconnect the AC signal source to the ADC or signal detector (e.g., ADC 130 in FIG. 1). At 295, the method ends.

A Second Exemplary Circuit for Determining a DC Level in AC-Coupled Circuitry

Figure 4:
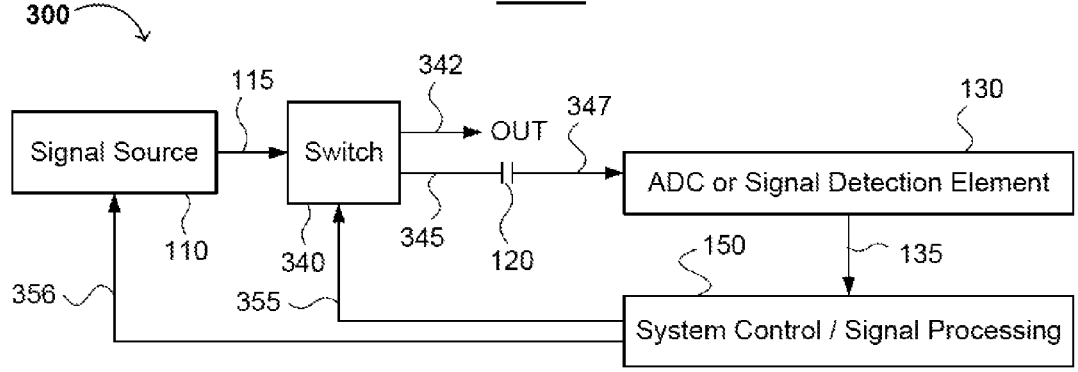
FIG. 4 is a diagram illustrating an exemplary circuit for determining a DC offset of an AC signal detector.

FIG. 4 shows an exemplary circuit 300 for determining a DC offset (e.g., a DC voltage level) of a circuit configured to receive and/or process an AC or AC-coupled signal. As shown, circuit 300 comprises an AC signal source 110, capacitor 120 (which is optional), ADC or signal detection element 130, system controller/signal processing circuitry 150 (each discussed above with respect to FIG. 1), and switch 340. As shown, signal source 110 provides an AC signal 115 to switch 340. Switch 340 receives AC signal 115 and one or more control and/or disable signal(s) 355 (discussed below in further detail), and provides signals 342 and 345. Capacitor 120 (or other capacitance, such as that provided by a capacitance array) receives the signal from switch 340 (e.g., signal 345) and provides a filtered or smoothed signal 347 to signal detection element or analog-to-digital converter (ADC) 130. Similar to signal detector/ADC 130 discussed above with respect to FIG. 1, the signal detection element 130 is configured to convert the received analog AC signal (e.g., signal 347) to a digital signal 135 suitable for processing by system control/system processing circuitry 150.

System controller 150 provides one or more signal(s) 355 to switch 340. The signal(s) 355 provided by system controller 150 includes a disable signal that is configured to open switch 340. Additionally, system controller 150 provides one or more signal(s) 356 (e.g., one or more feedback signals) to AC signal source 110. The signal(s) 356 may be configured to provide data or other information (e.g., one or more control signals) configured to adjust an output (e.g., increase a maximum power level, decrease a frequency, etc.) of AC signal source 110 during normal operation. Activation of the disable signal(s) 355 and/or feedback signal(s) 356 can be based on one or more predetermined criteria (e.g., exceeding a threshold, such as an acceptable variation in the AC signal 345 or 347, that may be determined or defined by software in system control/system processing circuitry 150) and/or one or more external control signals (e.g., provided by an external host or control circuit, etc.). In one embodiment, the disable signal(s) 355 is configured to turn off or disconnect the switch 340 for a predetermined amount of time.

As shown, switch 340 receives an output of AC signal source 110 (e.g., AC signal 115) and provides an AC signal 345 to capacitor 120. Alternatively, output 345 can be provided directly to signal detector/ADC 130. The opening (and subsequent closing) of switch 340 can be dependent upon one or more predetermined criteria (e.g., a threshold or conditional event, which may be defined by software in system controller 150) or an external control signal (e.g., from a host, another device in the network, etc.). For example, the switch 340 may be open for a predetermined amount of time (e.g., time duration 225 in FIG. 2), e.g., sufficient for system controller 150 to determine an off-state power level (e.g., $P_{OFF}$), or for an accurate DC level (e.g., caused by dark current in an optical detector) or other measurement of a DC component of an AC signal in the AC-coupled circuitry to be obtained (e.g., via a multi-meter, a millivolt meter or other voltage sensor, an oscilloscope, etc.).

Determination or measurement of the DC voltage level introduced by the AC-coupled circuitry (e.g., the DC offset) can be used to accurately calculate parameters of the AC or AC-coupled signal received by the AC-coupled circuitry. For example, the extinction ratio (ER) of AC signal 345 can be determined according to Equation [1] (discussed above) by utilizing the output of signal detector 130, as discussed below in further detail with respect to FIG. 6.

Figure 5A:
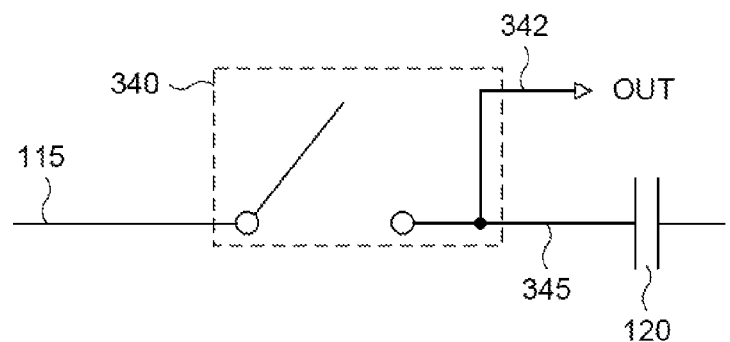
FIGS. 5A-C illustrate exemplary switches that can be used in the exemplary circuit of FIG. 4.

Additionally, switch 340 can be substantially any switch configured to connect and disconnect AC signal 115 (at a first terminal) and provide AC signal 345 (at a second terminal). For example, switch 340 may be represented by the schematic shown in FIG. 5A. As shown in FIG. 5A, switch 340 receives AC input signal 115, and when closed, provides AC output signal 345 and additional AC signal 342, which may be a substantial duplicate of AC signal 345, at a third terminal. AC signal 342 (e.g., signal OUT) can be provided to optional circuitry (not shown) downstream from the AC-coupled circuitry. As shown in FIG. 5A, in some embodiments, output AC signals 342 and 345 are branched from the same node. In embodiments in which AC signals 345 and 342 are not branched from the same node, when switch 340 receives a disable signal, switch 340 can turn off both AC signals 342 and 345, or switch from providing AC signal 345 to providing AC signal 342 (or vice versa).

Figure 5B:
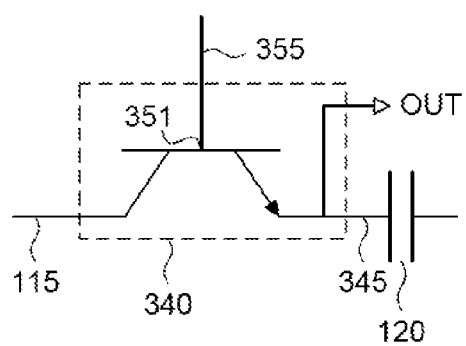
Figure 5C:
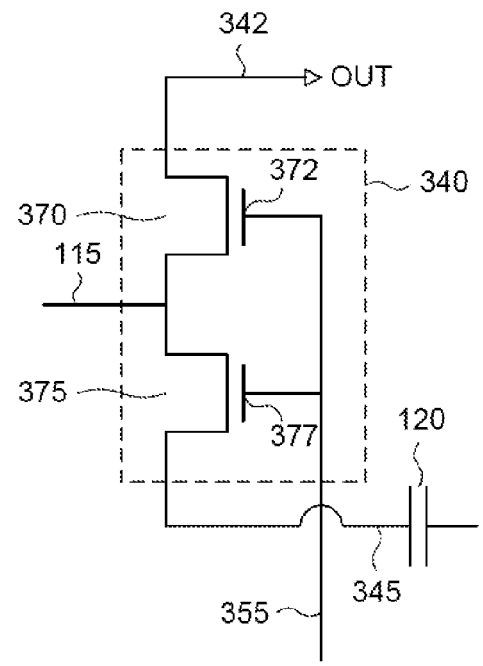

As shown in FIG. 5B, switch 340 can comprise a transistor (e.g., a bipolar junction transistor, or BJT), in which a first collector/emitter terminal of the transistor 340 is configured to receive AC signal 115, a control terminal 351 is configured to receive signal 355, and a second emitter/collector terminal is configured to provide AC signals 342 and 345. Alternatively, as shown in FIG. 5C, switch 340 can comprise a plurality of transistors (e.g., MOSFETs 370 and 375), in which a first (or common) source/drain terminal of each of transistors 370 and 375 receives the AC signal 115, the gate terminals 372 and 377 are configured to receive the disable signal 355, and a second source/drain terminal of each of the transistors 370 and 375 is configured to provide AC signals 342 and 345, respectively.

Figure 6:
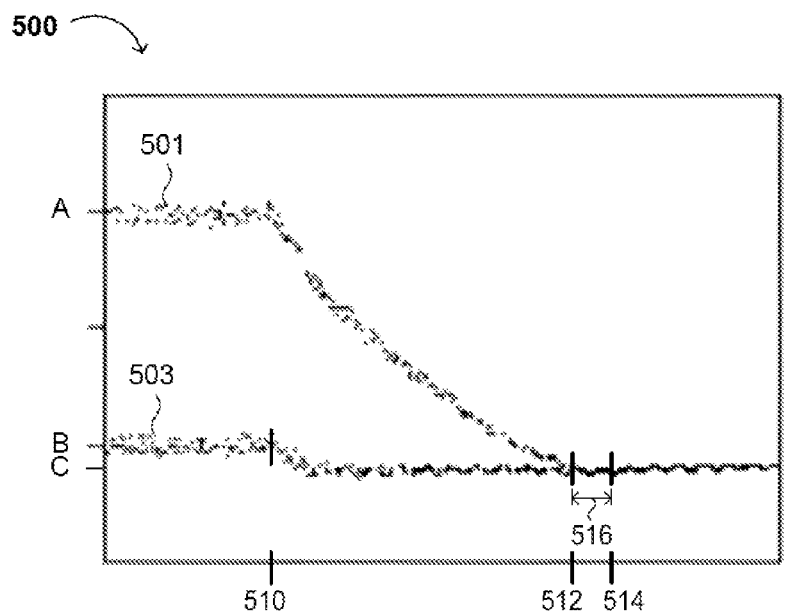
FIG. 6 is a graph illustrating an exemplary output of an AC signal source during a DC offset determination process according to the present invention.

As shown in FIG. 6, graph 500 shows an output of an ADC (e.g., signal detection element 130 in FIG. 4) receiving a sampled AC signal (e.g., AC signal 345 or 347 in FIG. 4). The sampled data points in FIG. 6 show the maximum power levels (e.g., power levels 501, having an approximate amplitude A) and minimum power levels (e.g., power levels 503, having an approximate amplitude B) of the AC signal. As shown, at time 510, the received AC signal provided to the ADC (e.g., which is in electrical communication with AC-coupled circuitry) is disconnected (e.g., via a switch 340, as shown in FIG. 4) so that the DC offset introduced by the AC-coupled circuitry (e.g., signal detector/ADC 130) can be determined. When the AC signal source is disconnected or disabled, the maximum and minimum power levels 501 and 503 decrease and coalesce at a power level C (e.g., an off-state voltage level) at 512, and remain constant until time 514. Thus, time duration 516 (i.e., the period of time between time 512 and time 514) provides a measurement window during which the DC offset (e.g., having an amplitude C) introduced by the AC-coupled circuitry into the sampled AC signal can be accurately measured or determined before the output of the disabled AC signal source begins to drift towards a common-mode or other AC-driven voltage (e.g., after time 514).

During time duration 516, the DC component (e.g., having an amplitude C) can be accurately measured or determined by a microprocessor or microcontroller (e.g., system control 150 in FIG. 4) or external devices configured to measure a voltage level (e.g., a multi-meter, millivolt meter, or oscilloscope). Additionally, as discussed above, the accurate DC level determination can be used to accurately calculate parameters (e.g., the extinction ratio) of the AC or AC-coupled signal. Thus, by disconnecting or disabling the AC signal, the DC component introduced by the AC-coupled circuitry can be accurately determined or measured during a subsequent time duration.

A First Exemplary Transceiver

Figure 7:
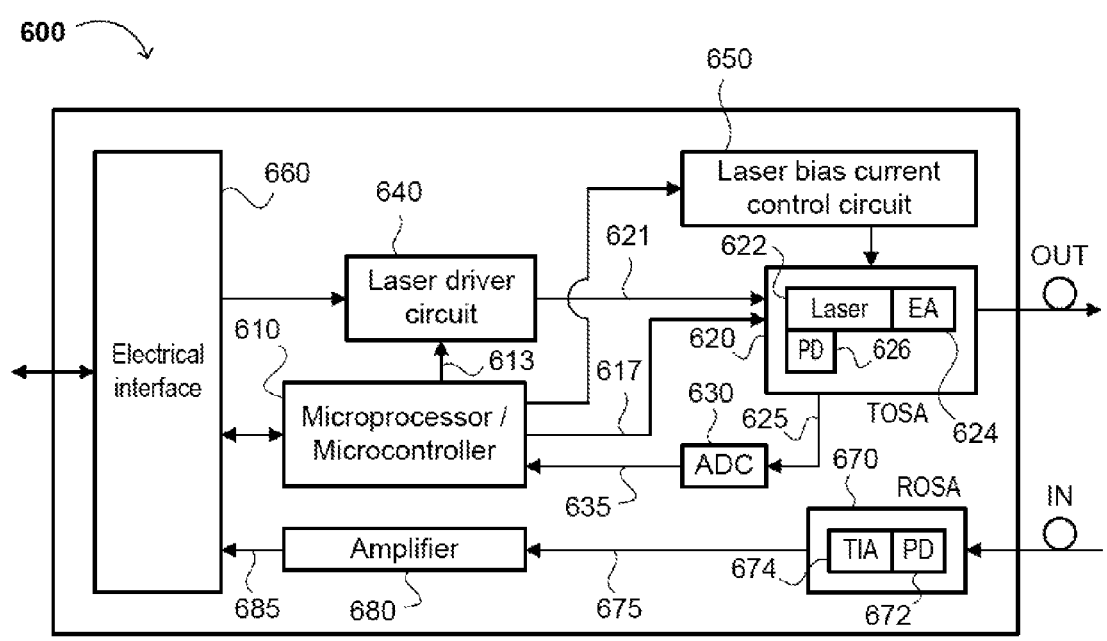
FIG. 7 is a diagram showing a first exemplary transceiver according to the present invention.

FIG. 7 illustrates an exemplary embodiment of a transceiver 600 configured to accurately determine a DC level in an AC or AC-coupled signal. As shown, transceiver 600 comprises a receiver optical sub assembly (ROSA) 670, an amplifier 680 (e.g., a limiting amplifier), electrical interface 660, a laser driver (or module) 640, control circuitry (e.g., a microprocessor or microcontroller) 610, a laser bias current control circuit 650, ADC 630, and a transmitter optical subassembly (TOSA) 620. In one embodiment, TOSA 620 comprises a laser diode 622, an electro-absorption (EA) modulator 624, and a sensing photodiode 626. In various embodiments, TOSA 620 may comprise a directly modulated laser (DML), an electro-absorption modulated laser (EML), or a distributed feedback laser diode (DFB-LD). Additionally, the bias current provided by laser bias current control circuit 650 to TOSA 620 can be pulse width modulated (PWM), programmed to provide a predetermined power and/or temperature range to the laser, etc. Furthermore, laser driver 640 can be configured to provide a driving current to any one of the different types of lasers (e.g., DML, EML, DFB-LD, etc.) discussed above.

As shown, ROSA 670 comprises a transimpedance amplifier (TIA) 674 and a photodiode (PD; e.g., a p-type/intrinsic/n-type [PIN] photodiode) 672. ROSA 670 is configured to receive an optical input signal IN (e.g., from an optical signal medium such as a fiber optic cable) and provide an electrical signal 675 to limiting amplifier 680. Limiting amplifier 680 is configured to amplify and limit the voltage of electrical signal 675 (e.g., to within a predetermined voltage range), and provide an amplified electrical signal 685 to electrical interface 660.

Electrical interface 660 is coupled to control circuit 610 via one or more busses, and transfers data and/or control signals (e.g., the electrical signal 685 or another signal from an electrical device in communication with transceiver 600) between transceiver 600 and an external host (not shown). Control circuit 610 is configured to control and/or regulate various functions of the transceiver (e.g., the data passing through the laser driver 640, the amount of current allowed by the laser bias current control circuit 650, etc.). Control circuit 610 can also be configured to control (i) the modulation amplitude provided by laser driver 640 (e.g., of a data signal provided via electrical interface 660) and/or (ii) the amplification of electrical signal 675 by amplifier 680.

Additionally, control circuit 610 is configured to receive an output of signal detector and/or analog-to-digital converter (ADC) 630 (e.g., signal 635). ADC 630 receives signal 625 (e.g., an analog AC signal) from TOSA 620. In one embodiment, the analog AC signal is received from sensing photodiode 626. Signal 625 may therefore be an electrical equivalent of optical output signal OUT. In another embodiment, the analog AC signal is received from laser driver 640. Signal 625 may therefore, in an alternative embodiment, be a substantial duplicate of data signal 621.

Control circuit 610 may also be configured to determine or calculate predetermined information (e.g., a maximum optical power, zero-level optical power, or other parameter value) from information provided by signal 635. Control circuit 610 can be configured to disable an output of laser driver 640 via one or more (control) signals 613 at predetermined times or in response to an external control signal. In one embodiment, signal 613 can be provided to laser driver 640 to disable modulation of the AC signal 621. The output of laser driver 640 can be disabled for a predetermined amount of time such that the zero-level power of the AC signal 621 remains steady (e.g., at an approximate amplitude C in FIG. 6) for a time duration sufficient for DC level measurement or determination. When the DC level of the output 621 of laser driver 640 has been determined, an extinction ratio can be calculated (e.g., utilizing Equation [1] above).

In some embodiments, when the extinction ratio has been accurately calculated, control circuit 610 can compare the calculated extinction ratio with a predetermined extinction ratio, and when the two extinction ratios are not equal or the calculated extinction ratio is not within a predetermined extinction ratio range, provide one or more additional control signals 613 to laser driver 640. For example, one or more signals 613 can be configured to adjust one or more performance characteristics of laser driver 640 in order to bring an output 621 of laser driver 640 into a predetermined range of values. In one embodiment, the signal(s) 613 can be configured to increase or decrease a maximum or minimum power level of signal 621 such that the calculated extinction ratio is equal to the predetermined extinction ratio, or within a predetermined extinction ratio range. However, the present invention is not limited to calculating only the extinction ratio and bringing the performance characteristics of AC-coupled circuitry into conformance with a predefined extinction ratio or range of extinction ratio values. The present invention can be applied to the calculation of values of other characteristics or parameters of AC signals useful for monitoring and/or adjusting circuit performance in other applications.

Thus, by disabling the AC signal, the DC level or component of the AC or AC-coupled signal can be accurately determined or measured during a subsequent time period for such measurement or determination.

A Second Exemplary Transceiver

Figure 8:
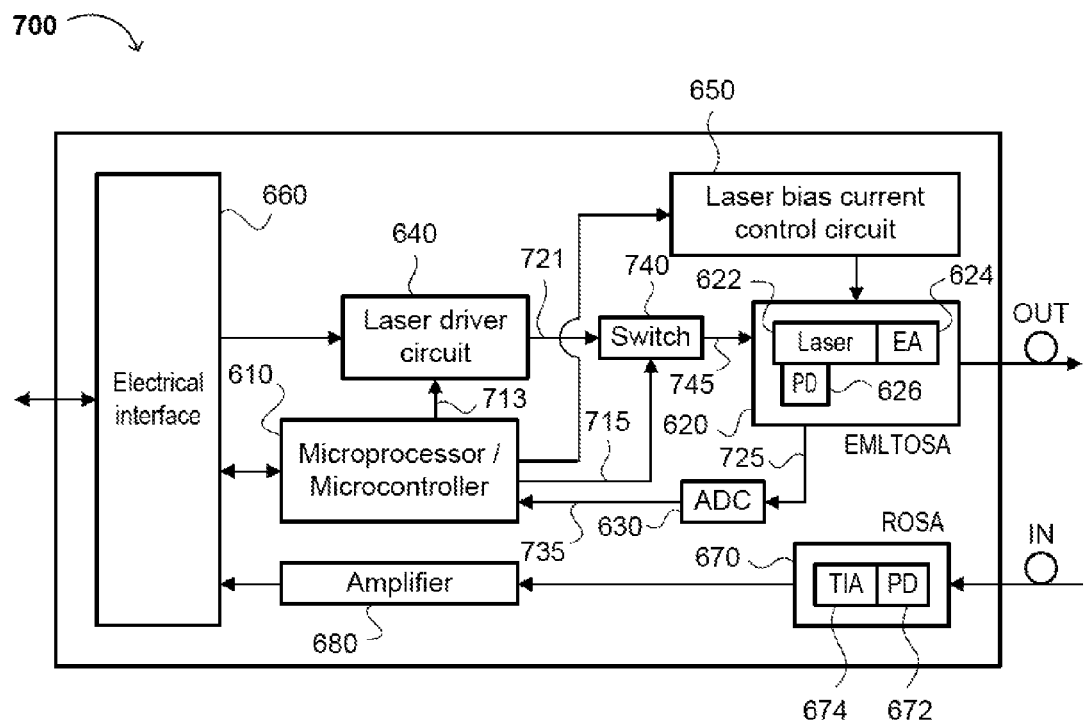
FIG. 8 is a diagram showing a second exemplary transceiver according to the present invention.

FIG. 8 illustrates a transceiver 700 for determining a DC offset in AC or AC-coupled circuitry (e.g., circuitry receiving and/or processing an AC signal). As shown, transceiver 700 comprises circuitry similar to that of transceiver 600 of FIG. 7, wherein structures having the same identification numbers discussed below with respect to FIG. 8 may be substantially the same as those discussed above with respect to FIG. 7. Specifically, transceiver 700 comprises a receiver optical sub assembly (ROSA) 670, an amplifier 680 (e.g., a limiting amplifier), electrical interface 660, a laser driver (or module) 640, control circuitry (e.g., a microprocessor or microcontroller) 610, a laser bias current control circuit 650, ADC 630, and a transmitter optical subassembly (TOSA) 620. Transceiver 700 also comprises a switch 740 that is configured to electrically connect and disconnect the output 721 of laser driver 640 from an input to TOSA 620.

Specifically, switch 740 is configured to receive AC signal 721 (from laser driver 640) and a signal 715 (discussed below in further detail) from control circuit 610. Signal 715 is configured to open and close switch 740, similar to control signal 355 in FIGS. 4 and 5A-5C. When switch 740 is closed, AC signal 745 (which may be an electrical equivalent of AC signal 721) is provided to TOSA 620. When switch 740 is open, the output (e.g., AC signal 721) of laser driver 640 is electrically disconnected from TOSA 620, and a high-impedance state may exist at the input 745 to TOSA 620.

Control circuit 610 receives output signal 735 from ADC 630. As described above, signal 735 is a digital representation of analog/AC signal 725. During normal operation, signal 725 may be an electrical equivalent of optical signal OUT, but when switch 740 is open, signal 725 represents the DC offset of either (i) ADC 630 or (ii) TOSA 620 (more specifically, of laser diode 622 and sensing photodiode 626). Control circuit 610 may be configured to determine or calculate predetermined parameter values (e.g., a maximum optical power, zero-level optical power, etc.) from information provided by signal 735. Control circuit 610 may also be configured to adjust an output of laser driver 640 in response to one or more differences between the information provided by signal 735 and corresponding predetermined value(s) of the calculated parameter, via one or more (control) signals 713, similar to the configuration in FIG. 7. Furthermore, control circuit 610 may be configured to determine when to provide signal 715 to switch 740. The determination to provide signal 715 may be based on external information (e.g., a control signal received from an electrical device in communication with transceiver 700) or predetermined criteria (e.g., an excursion of the calculated parameter value outside the predetermined range of values; an output from a timing circuit configured to open switch 740 at predetermined intervals so that a DC offset of AC-coupled circuitry can be periodically determined or measured; etc.).

Switch 740 can remain open for any predetermined amount of time sufficient to maintain the zero-level power of the AC-coupled circuitry (e.g., at an approximate amplitude C in FIG. 6) and/or to measure or determine the DC level of AC signal 725. Measurement of the DC offset can include the use of an external measurement device (e.g., a multi-meter, a millivolt meter, an oscilloscope, etc.) electrically connected to the control circuit 610. When the DC offset introduced by the AC-coupled circuitry has been determined, an extinction ratio or other characteristic value of the circuitry can be calculated (e.g., utilizing Equation [1] above).

Thus, by disconnecting or disabling the AC signal, the DC offset introduced by the AC-coupled circuitry can be accurately determined or measured during a subsequent time period for measurement or determination.

CONCLUSION/SUMMARY

Thus, the present invention provides methods, circuits, architectures, apparatuses, and algorithms for determining a DC level in an AC or AC-coupled signal and/or a DC offset in AC signal detection and/or processing circuitry, and calculating a value of one or more parameters based on the DC level. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining (i) a DC level or component in an AC signal or (ii) a DC offset of AC-coupled circuitry that receives the AC signal, wherein the AC-coupled circuitry is included in an optical or optoelectronic transmitter or transceiver configured to receive or provide the AC signal, the method comprising:

driving said optical or optoelectronic transmitter with said AC signal or providing said AC signal from a signal detector in said optical or optoelectronic transceiver:

disabling said AC signal or disconnecting said AC signal from said optical or optoelectronic transmitter or said signal detector;

sampling said disabled or disconnected AC signal to obtain sampled DC values of said disabled or disconnected AC signal; and obtaining or measuring said DC level, component or offset from said sampled DC values of said AC signal.

2. The method of claim 1, further comprising enabling said AC signal after sampling said disabled or disconnected AC signal at least once, but prior to said disabled or disconnected AC signal approaching a common-mode voltage.

3. The method of claim 1, wherein disabling said AC signal comprises switching off said AC signal.

4. The method of claim 3, further comprising executing a command in a microprocessor or a microcontroller, wherein said command is configured to switch off said AC signal.

5. The method of claim 1, wherein sampling said disabled or disconnected AC signal comprises converting an analog value of said disabled or disconnected AC signal to a digital value.

6. The method of claim 1, further comprising calculating or determining a characteristic or parameter value of said AC signal.

7. The method of claim 6, further comprising, prior to disabling or disconnecting said AC signal, sampling said AC signal to obtain sampled AC values of said AC signal.

8. The method of claim 7, wherein said characteristic or parameter value is an extinction ratio of said AC signal, and said method further comprises calculating said extinction ratio from at least first and second sampled AC values and said DC level, component or offset of said AC signal.

9. The method of claim 1, wherein said optical or optoelectronic transmitter comprises a laser diode.

10. The method of claim 9, wherein said laser diode provides said optical signal directly from the AC signal.

11. The method of claim 1, wherein said AC signal is disconnected from said optical or optoelectronic transmitter.

12. The method of claim 11, wherein said optical or optoelectronic transmitter comprises laser driver circuitry configured to provide said AC signal, and a microcontroller or microprocessor configured to (i) control said signal source, (ii) receive information about the AC signal from said signal detector, and (iii) disconnect said signal source for a predetermined length of time.

13. The method of claim 1, wherein said microcontroller or microprocessor controls a switch coupled between said laser driver circuitry and said laser diode, said switch being configured to disconnect said laser driver circuitry.

14. The method of claim 1, wherein said AC signal is provided by said signal detector.

15. The method of claim 14, wherein said AC signal is disconnected from said signal detector.

16. The method of claim 15, wherein said optical or optoelectronic transmitter comprises a microcontroller or microprocessor configured to receive information about the AC signal from said signal detector, and to deactivate an output of said signal detector or disconnect a power supply to said signal detector.

17. The method of claim 15, wherein the signal detector comprises an analog-to-digital converter (ADC) configured to convert said information to a digital signal.

18. The method of claim 17, wherein said signal detector comprises a photodetector configured to convert said optical signal to an analog electrical signal, and said analog-to-digital converter converts said analog electrical signal to said digital signal.

19. The method of claim 1, further comprising transferring data and control signals across an electrical interface between said optical or optoelectronic transmitter and an external host.

* * * * *